US012588524B2

(12) United States Patent
Sun et al.

(10) Patent No.: US 12,588,524 B2
(45) Date of Patent: Mar. 24, 2026

(54) STACKED VIA MODULATOR IN HIGH SPEED INTERCONNECT

(71) Applicant: Intel Corporation, Santa Clara, CA (US)

(72) Inventors: Jiwei Sun, Chandler, AZ (US); Zhiguo Qian, Chandler, AZ (US); Kemal Aygün, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 849 days.

(21) Appl. No.: 17/707,342

(22) Filed: Mar. 29, 2022

(65) Prior Publication Data

US 2023/0317588 A1      Oct. 5, 2023

(51) Int. Cl.
*H01L 23/498* (2006.01)
*H01L 23/66* (2006.01)

(52) U.S. Cl.
CPC .. *H01L 23/49827* (2013.01); *H01L 23/49838* (2013.01); *H01L 23/66* (2013.01); *H01L 2223/6616* (2013.01)

(58) Field of Classification Search
CPC ......... H01L 23/49827; H01L 23/49838; H01L 23/66
See application file for complete search history.

(56) References Cited

U.S. PATENT DOCUMENTS

| | | | |
|---|---|---|---|
| 2016/0165723 A1* | 6/2016 | Romero | ............ H01L 23/49827 174/251 |
| 2017/0194248 A1* | 7/2017 | Das | ..................... H01L 23/5329 |
| 2020/0066659 A1* | 2/2020 | Lambert | ........... H01L 23/49582 |
| 2024/0079303 A1* | 3/2024 | Lin | ......................... H01L 24/05 |

* cited by examiner

*Primary Examiner* — Michael Jung
(74) *Attorney, Agent, or Firm* — Schwabe, Williamson & Wyatt P.C.

(57) ABSTRACT

Embodiments disclosed herein include electronic packages In an embodiment, the electronic package comprises first substrate layers, and a core under the first substrate layers. In an embodiment, second substrate layers are under the core, and an interconnect is through the first substrate layers, the core, and the second substrate layers. In an embodiment, a portion of the interconnect through the second substrate layers comprises a pad, and a plurality of vias extending away from the pad.

19 Claims, 10 Drawing Sheets

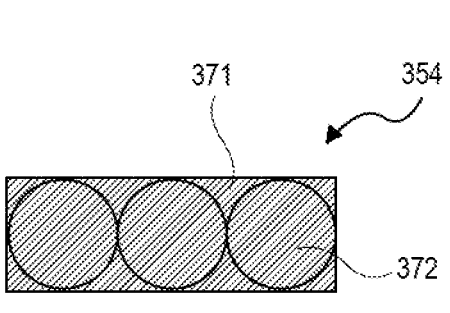
FIG. 3B
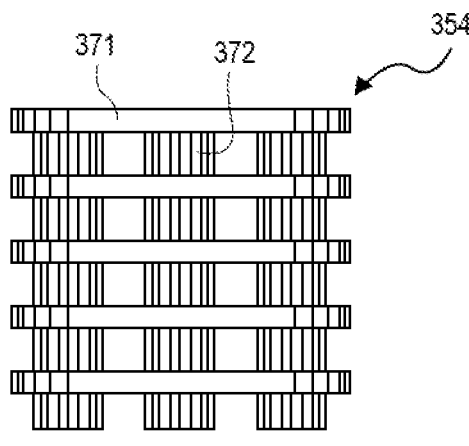
FIG. 3C
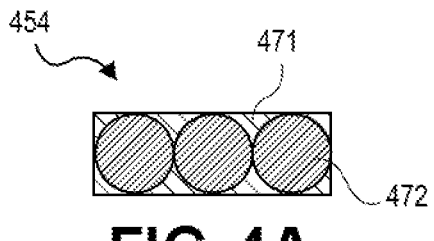
FIG. 4A
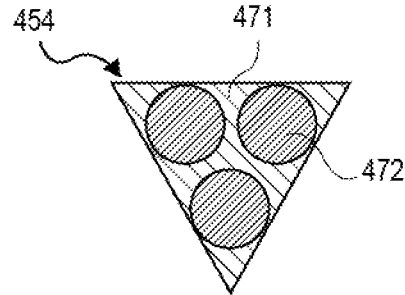
FIG. 4B
FIG. 4C

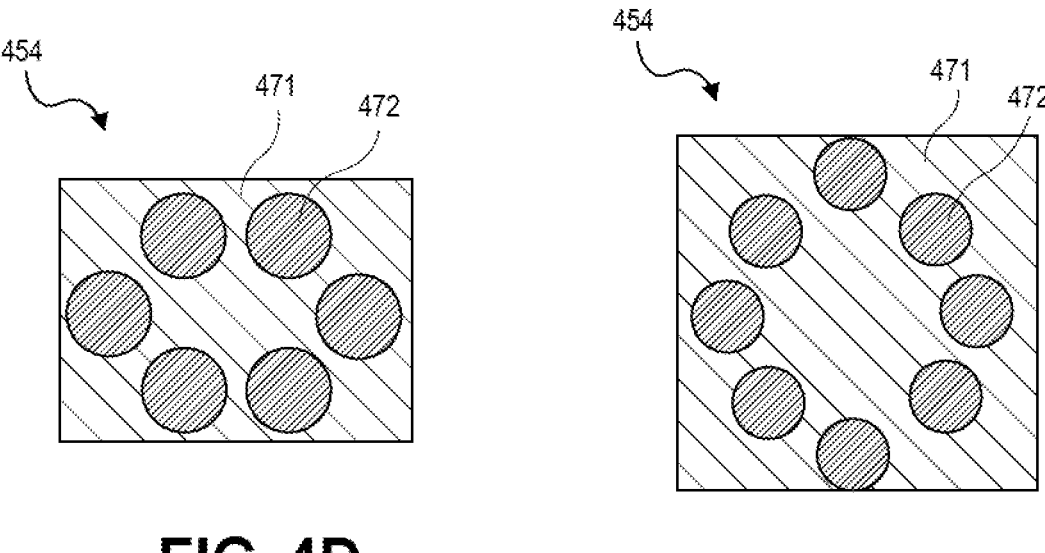
FIG. 4D
FIG. 4E
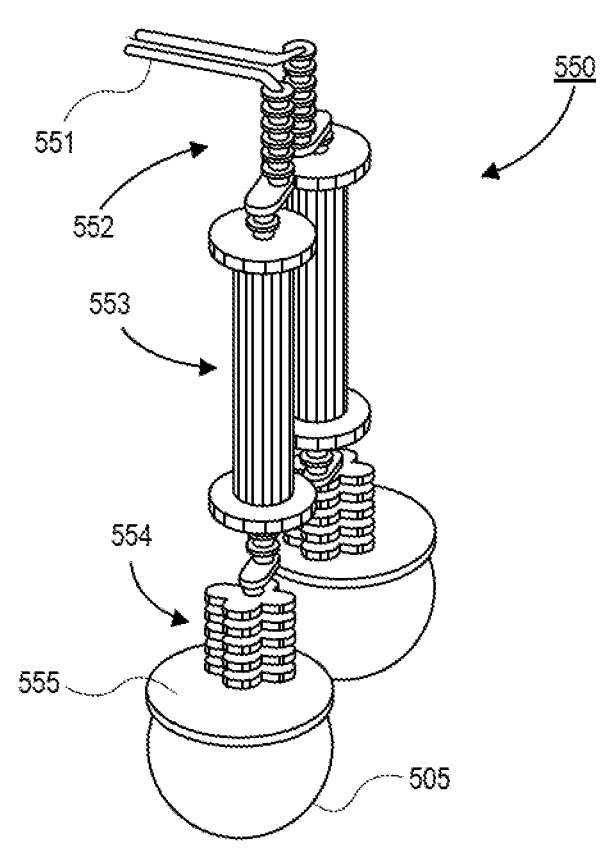
FIG. 5A

STACKED VIA MODULATOR IN HIGH SPEED INTERCONNECT

TECHNICAL FIELD

Embodiments of the present disclosure relate to electronic packages, and more particularly to high speed interconnect architectures with capacitive and/or inductive via modulators.

BACKGROUND

The ever increasing I/O bandwidth demand in data centers necessitates serializer/deserializer (SerDes) transceivers to operate towards 200 Gbps or more. Ball grid array (BGA) packages are a critical component in the SerDes channel. As the data rate increases, a package vertical transition (e.g., stacked micro vias, plated through holes (PTHs) and BGA balls) creates a larger impedance discontinuity in the signaling path. This has become a major problem that must be overcome to meet the 200 Gbps or more bandwidth requirements.

One approach is to optimize the void size between a signal via pad and ground planes on each via transition layer. This voiding scheme can achieve a better impedance matching of a package vertical transition and increase its bandwidth. The other approach is to reduce the BGA ball size. Smaller solder balls reduce the capacitance and minimizes the impedance discontinuity, and, therefore, increases the bandwidth.

However, relying on the void size optimization on each via-transition layer makes it challenging to meet the 200 Gbps or more bandwidth requirement, especially in packages with high layer count (e.g., greater than 12 layers). The impedance profile of a package vertical transition has an inductive peak, due to the large shadow voiding in the backside metal layers required to minimize the solder joint capacitance. This impedance discontinuity becomes a bandwidth limiter. The 1 dB bandwidth is only about 50 GHz, which is not capable of supporting SerDes speeds beyond 200 Gbps.

Smaller solder balls can also decrease the capacitance. However, on large packages (e.g., 50 mm by 50 mm), smaller solder balls can easily result in solder joint defects. For example, solder bridging at the center of the package and non-contact opens at the corners of the package can occur due to the dynamic warpage. In addition, the power delivery performance is impaired by the smaller solder balls.

BRIEF DESCRIPTION OF THE DRAWINGS

FIG. 3B is a plan view of the pads and vias in the backside layers of the package substrate, in accordance with an embodiment.

FIG. 3C is a cross-sectional illustration of the pads and vias in the backside layers of the package substrate, in accordance with an embodiment.

FIG. 4A is a plan view illustration of a pad and vias with a rectangular layout in the backside layers of the package substrate, in accordance with an embodiment.

FIG. 4B is a plan view illustration of a pad and vias with a triangular layout in the backside layers of the package substrate, in accordance with an embodiment.

FIG. 4C is a plan view illustration of a pad and vias with a rectangular layout in the backside layers of the package substrate, in accordance with an embodiment.

FIG. 4D is a plan view illustration of a pad and vias with a hexagon layout in the backside layers of the package substrate, in accordance with an embodiment.

FIG. 4E is a plan view illustration of a pad and vias with a circular layout in the backside layers of the package substrate, in accordance with an embodiment.

FIG. 5A is a perspective view illustration of a vertical connection that includes an capacitance boost feature in the backside layers of the package substrate, in accordance with an embodiment.

EMBODIMENTS OF THE PRESENT DISCLOSURE

Described herein are high speed interconnect architectures with capacitive and/or inductive via modulators, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, in high speed SerDes architectures, it may be necessary to decrease the capacitance of the solder balls in the vertical interconnect. One solution to reduce capacitance is to implement ground metal voiding in the backside routing layers of the electronic package. However, such voiding results in an inductive peak that limits bandwidth. Another option is to reduce the size of the solder balls. Unfortunately, reducing solder ball volume can result in assembly defects.

Figure 1:
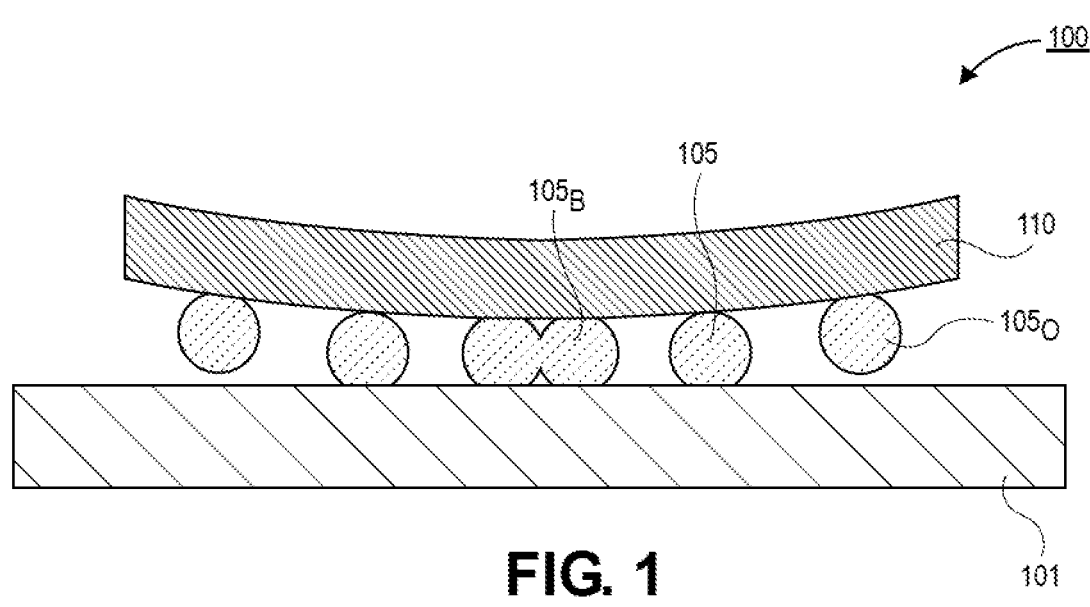
FIG. 1 is a cross-sectional illustration of an electronic package coupled to a board with small solder balls that lead to solder bridging and/or non-contact opens.

An example of reduced volume solder balls is shown in FIG. 1. As shown, the electronic system 100 includes a board 101 (such as a printed circuit board (PCB)). The package substrate 110 is coupled to the board 101 by solder balls 105. However, the warpage of the package substrate 110 results in solder defects. For example, at the center of the package substrate 110 solder bridging 105E can occur, and at the edge of the package substrate 101 non-contact opens 105o can occur.

Figure 2A:
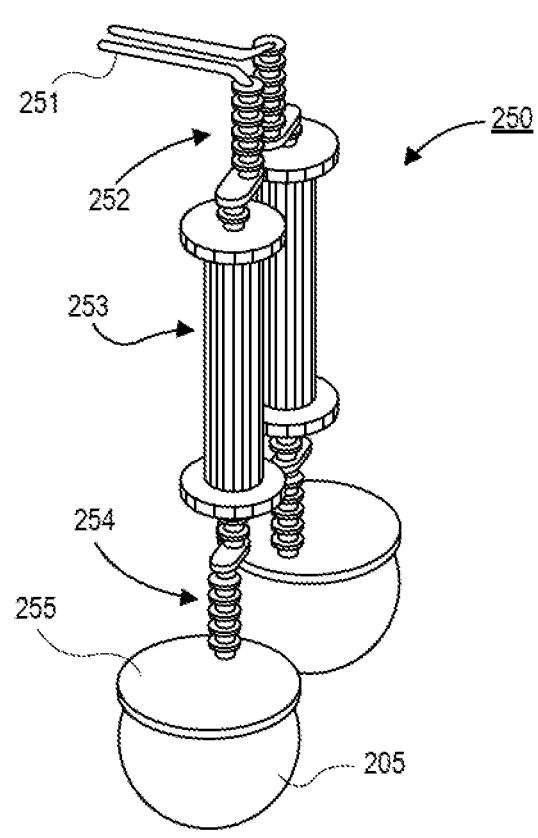
FIG. 2A is a perspective view illustration of a vertical interconnect through a package substrate.

Referring now to FIG. 2A, a perspective view illustration of a vertical interconnect 250 is shown. The vertical interconnect 250 may be embedded in a package substrate. The layers of the package substrate are omitted in order to more clearly illustrate the vertical interconnect 250. In the illustration, a pair of interconnects 250 are shown. Such a configuration may be used as a differential signaling pair. However, in other architectures, a single ended signaling vertical interconnect 250 may also be used.

As shown, the vertical interconnect 250 comprises a trace 251 at a top side of the vertical interconnect. The trace 251 may be coupled to a plated through hold (PTH) 253 through a core by micro vias 252 in the front side routing layers. The PTH 253 may be coupled to a bottom pad 255 by micro vias 254 through the backside routing layers. The bottom pad 255 may be coupled to a solder ball 205.

Figure 2B:
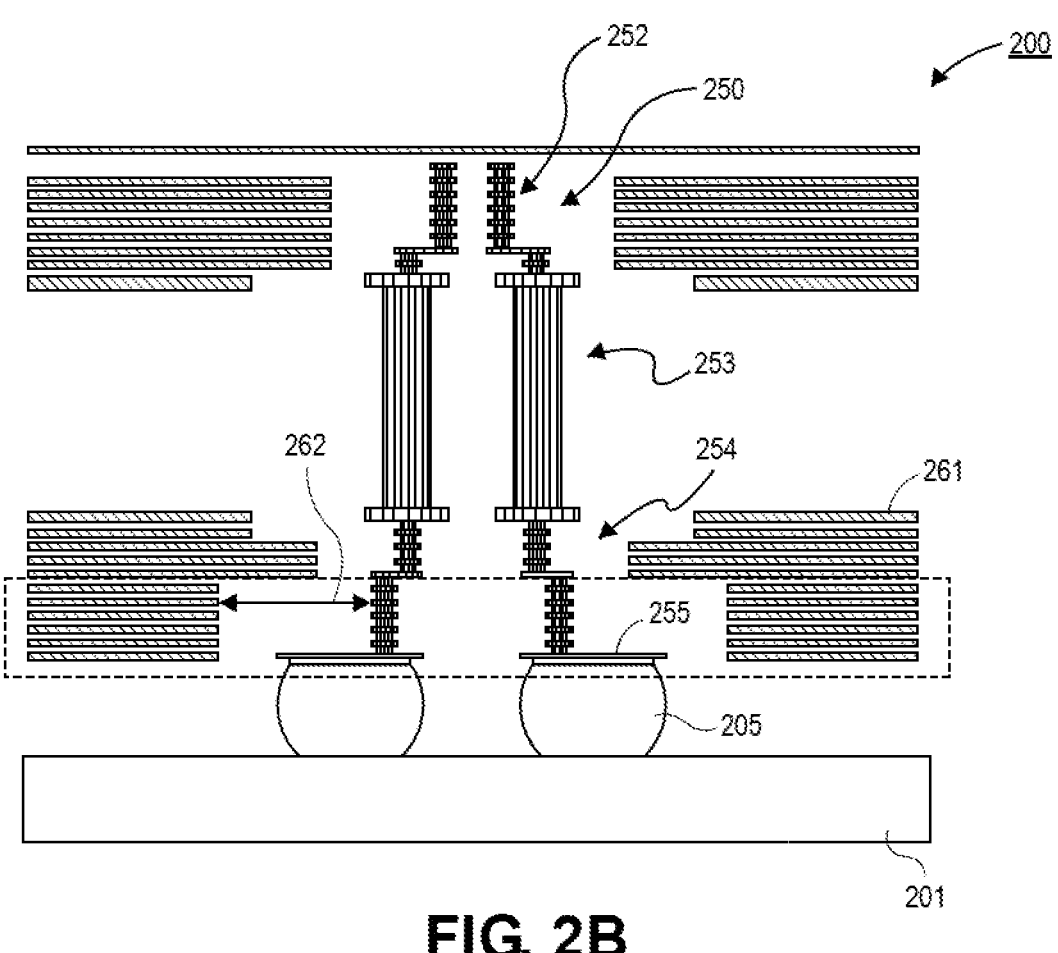
FIG. 2B is a cross-sectional illustration of the vertical interconnect through the package substrate that illustrates ground plane voiding in the backside of the package substrate.

Referring now to FIG. 2B, a cross-sectional illustration of the vertical interconnects 250 is shown. FIG. 2B also includes the presence of ground plane traces 261 that are provided on each of the routing layers in the package substrate. As shown, the ground plane traces 261 may be voided proximate to the micro vias 254 in the backside routing layers. As indicated by the arrow 262, the edge of the ground plane traces 261 are spaced away from the micro vias 254. The ground plane traces 261 voiding may reduce the capacitance of the solder balls 205 that are connected to the board 201.

Figure 2C:
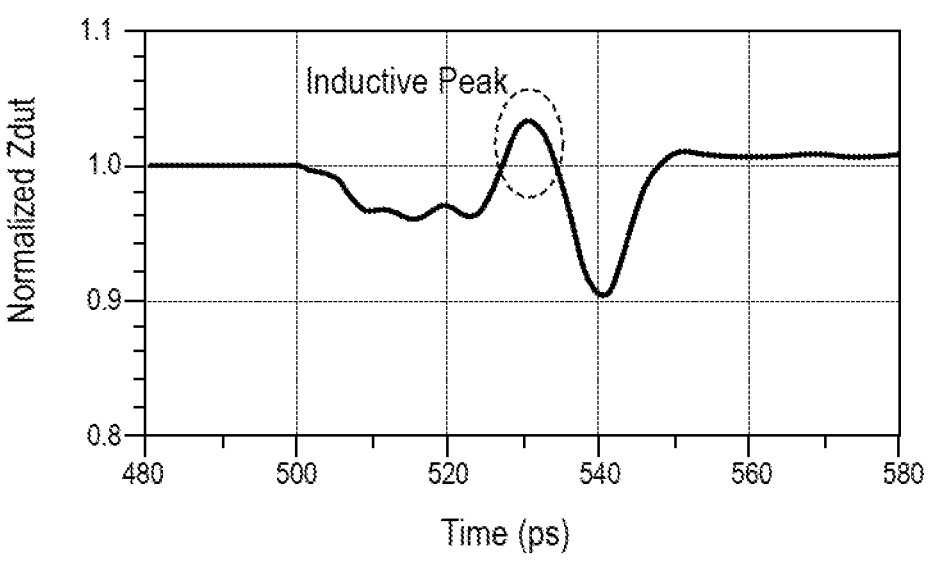
FIG. 2C is a graph of the impedance profile that shows an inductive peak.

While such an architecture reduces the capacitance of the solder balls 205, the voiding architecture results in an inductive peak in the impedance profile. The inductive peak is highlighted in the impedance profile shown in FIG. 2C. The inductive peak results in a decrease in the bandwidth and does not allow for high speed signaling (e.g., at 200 Gbps or greater).

Accordingly, embodiments disclosed herein include architectures that eliminate or reduce the presence of the inductive peak in the impedance profile. Generally, the differential impedance is provided by Equation 1. In Equation 1, L and $L_M$ are the self-inductance and mutual inductance, respectively. C and $C_M$ are the self-capacitance the mutual capacitance, respectively. The self-inductance or self-capacitance associated with certain vertical transitions can be tuned to balance the inductive peak and reduce the impedance discontinuity. Either reducing self-inductance or increasing self-capacitance can help to mitigate the inductive dominant impedance of the backside vertical transition.

$$Z_{diff} = 2\sqrt{\frac{L - L_M}{C + C_M}}$$
Equation 1

As such, embodiments disclosed herein include backside vertical transitions that either decrease the self-inductance (referred to herein as an inductance reduction modulator) or increase the self-capacitance (referred to herein as a capacitance boost modulator). The inductance reduction modulator may be implemented with micro via stack clustering. Instead of a single via between pads in the backside routing layers, a plurality of vias are provided between the pads. The capacitance boost modulator may include stubs that extend out from the center pad. In some instances, the stubs may include distal pads that further increase the capacitance of the vertical transition. As will be shown in the graphs towards the end of the specification, the capacitance boost modulator and the inductance reduction modulator result in significantly improved electrical performance. This enables operation at 200 Gbps or greater.

Figure 3A:
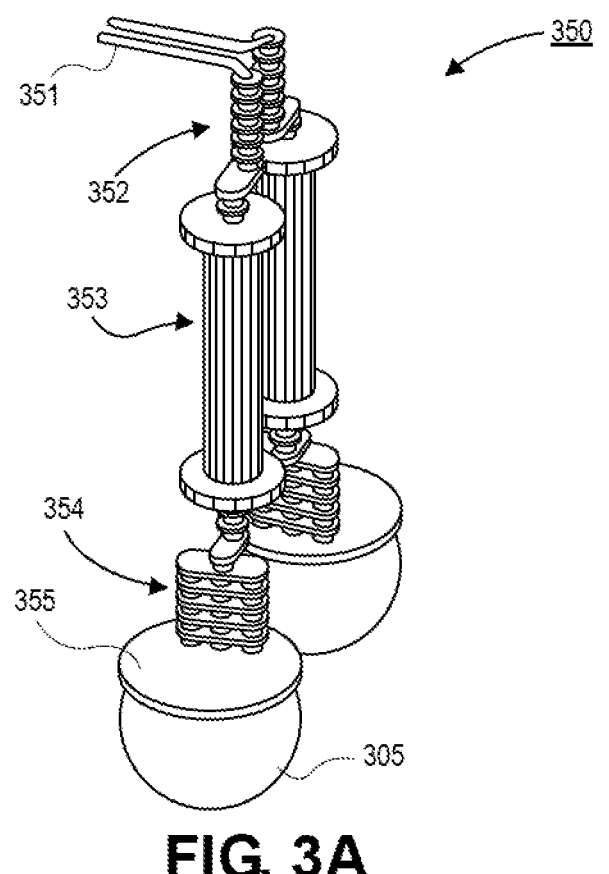
FIG. 3A is a perspective view illustration of a vertical connection that includes an inductance reduction feature in the backside layers of the package substrate, in accordance with an embodiment.

Referring now to FIG. 3A, a perspective view illustration of a vertical interconnect 350 is shown, in accordance with an embodiment. In the illustrated embodiment a pair of vertical interconnects 350 are shown in order to implement differential signaling. However, in other embodiments, it is to be appreciated that single ended signaling may also benefit from embodiments disclosed herein. In FIG. 3A the package substrate layers (e.g., front side layers, core, and backside layers) are omitted in order to more clearly see the structure of the vertical interconnects 350.

In an embodiment, the vertical interconnect 350 may include a trace 351 at the top of the package substrate. Micro vias 352 may be provided below the trace 351 to provide an electrical connection through the front side packaging layers. The micro vias 352 may couple the trace 351 to a PTH 353. The PTH 353 may pass through a core of the package substrate. In some embodiments, the core may be a glass reinforced organic material. In other embodiments, the core may be a glass core. It is to be appreciated that both core types benefit from embodiments disclosed herein.

In an embodiment, the PTH 353 may be coupled to a bottom pad 355 on the backside of the package substrate by an inductance reduction modulator 354. The bottom pad 355 may be coupled to a solder ball 305. As shown, the inductance reduction modulator 354 may comprise pads that are coupled together by a plurality of vias instead of a single via, as shown above. The increase in the number of vias in each layer reduces the inductance of the vertical interconnect 350. In the illustrated embodiment, three vias are provided on each layer of the inductance reduction modulator 354. However, as will be described in greater detail below, the number and orientation of the vias may be varied in order to provide a desired amount of inductance reduction.

Referring now to FIG. 3B, a plan view illustration of a layer of the inductance reduction modulator 354 is shown, in accordance with an embodiment. As show, the pad 371 may be a rectangular pad. The rectangular pad 371 may be sized in order to accommodate a plurality of vias 372 below the pad 371. In the illustrated embodiment, three vias 372 are shown. However, it is to be appreciated that the number of vias 372 may be two or more vias 372.

Referring now to FIG. 3C, a cross-sectional illustration of the inductance reduction modulator 354 is shown, in accordance with an embodiment. As shown, each layer may include a pad 371. The pads 371 are connected to each other by a plurality of vias 372 through each layer. The pads 371 short each of the vias 372 together, thereby increasing the effective cross-sectional area of the inductance reduction modulator. In an embodiment, each layer may include the same number of vias 372. For example, each layer in FIG. 3C illustrates three vias 372. However, in other embodiments, the layers may have non-uniform numbers of vias 372. For example, a first layer may include three vias 372, and a second layer may include two vias 372. In the illustrated embodiment, five layers are shown. However, it is to be appreciated that the number of layers may include one or more layers.

Referring now to FIGS. 4A-4E, a series of plan view illustrations depicting various pad and via configurations is shown, in accordance with an embodiment. While several examples are shown herein, it is to be appreciated that other architectures may also be used so long as the architecture includes a pad and at least two vias extending out from the pad.

Referring now to FIG. 4A, a plan view illustration of a layer of an inductance reduction modulator 454 is shown, in accordance with an embodiment. As shown, the inductance reduction modulator 454 includes a rectangular pad 471. The rectangular pad 471 may have a length that allows for a plurality of vias 472 to be arranged in a row. For example, the number of vias 472 shown in FIG. 4A includes three vias 472. However, more or fewer vias 472 may be included in some embodiments. In the illustrated embodiment, the vias 472 are shown as touching each other. However, in other embodiments, space may be provided between the vias 472 (e.g., as shown in the cross-sectional view in FIG. 3C).

Referring now to FIG. 4B, a plan view illustration of a layer of an inductance reduction modulator 454 is shown, in accordance with an additional embodiment. As shown, the inductance reduction modulator 454 includes a triangular pad 471. The triangular pad 471 may have sides with lengths that allows for the inclusion of a plurality of vias 472 within the footprint of the triangular pad 471. For example, three vias 472 are provided within the footprint of the triangular pad 471. In an embodiment, the vias 472 may each be proximate to a corner of the triangle. However, other layout configurations may also be used in other embodiments.

Referring now to FIG. 4C, a plan view illustration of an inductance reduction modulator 454 is shown, in accordance with an additional embodiment. As shown, the inductance reduction modulator 454 includes a square shaped pad 471. The square shaped pad 471 may include a footprint that allows for the inclusion of a plurality of vias 472. In the illustrated embodiment, a set of four vias 472 are provided within the footprint of the square shaped pad 471. Each of the vias 472 may be provided proximate to a corner of the square shaped pad 471. However, it is to be appreciated that embodiments may include other layouts and/or different numbers of vias 472.

Referring now to FIG. 4D, a plan view illustration of an inductance reduction modulator 454 is shown, in accordance with an additional embodiment. As shown, the inductance reduction modulator 454 includes a rectangular shaped pad 471. The rectangular shaped pad may include a footprint that allows for the inclusion of a plurality of vias 472. In a particular embodiment, the vias 472 may be arranged in a hexagon pattern. That is, the vias 472 are not limited to be formed in a one-dimensional row, as shown in FIG. 4A. In the illustrated embodiment, the hexagon pattern is formed with six vias 472. However, it is to be appreciated that more vias 472 may be used to form a polygonal shaped layout of the vias, in accordance with additional embodiments.

Referring now to FIG. 4E, a plan view illustration of an inductance reduction modulator 454 is shown, in accordance with an additional embodiment. As shown, the inductance reduction modulator 454 includes a rectangular shaped pad 471. The rectangular shaped pad 471 may include a footprint that allows for the inclusion of a plurality of vias 472. In an embodiment, the plurality of vias 472 may be arranged in circular pattern. For example, eight vias 472 may be used to form a circular pattern of vias. However, it is to be appreciated that more or fewer vias 472 may be used to form a circular shaped layout of the vias 472 in other embodiments.

Referring now to FIG. 5A, a perspective view illustration of a vertical interconnect 550 is shown, in accordance with an embodiment. In the illustrated embodiment a pair of vertical interconnects 550 are shown in order to implement differential signaling. However, in other embodiments, it is to be appreciated that single ended signaling may also benefit from embodiments disclosed herein. In FIG. 5A the package substrate layers (e.g., front side layers, core, and backside layers) are omitted in order to more clearly see the structure of the vertical interconnects 550.

In an embodiment, the vertical interconnect 550 may include a trace 551 at the top of the package substrate. Micro vias 552 may be provided below the trace 551 to provide an electrical connection through the front side packaging layers. The micro vias 552 may couple the trace 551 to a PTH 553. The PTH 553 may pass through a core of the package substrate. In some embodiments, the core may be a glass reinforced organic material. In other embodiments, the core may be a glass core. It is to be appreciated that both core types benefit from embodiments disclosed herein.

In an embodiment, the PTH 553 may be coupled to a bottom pad 555 on the backside of the package substrate by a capacitance boost modulator 554. The bottom pad 555 may be coupled to a solder ball 505. As shown, the capacitance boost modulator 554 may comprise pads that include stubs that extend out from the central pad. Each layer may include stubs, and the stubs on the different layers may overlap each other. The overlapping surface area of the stubs increases the capacitance of the vertical interconnect 350.

Figure 5B:
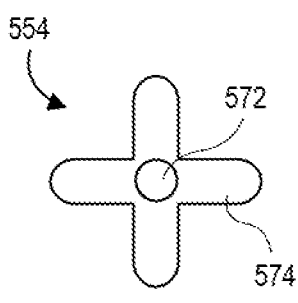
FIG. 5B is a plan view illustration of the capacitance boost feature in the backside layers of the package substrate, in accordance with an embodiment.

Referring now to FIG. 5B a plan view illustration of a layer of the capacitance boost modulator 554 is shown, in accordance with an embodiment. In an embodiment, the capacitance boost modulator 554 includes a cross-shaped architecture. The cross-shaped architecture includes stubs 574 that extend out from a central region of the pad. In an embodiment, a via 572 may extend down from the central region of the pad. While the stubs 574 are shown as having a cross-shaped layout, it is to be appreciated that other layouts may also be used. For example, instead of four stubs 574, fewer stubs 574 (e.g. one or more) may be used, or more than four stubs 574 may be used.

Figure 5C:
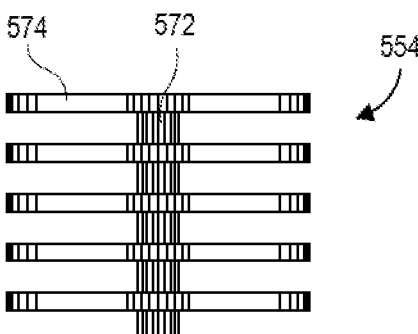
FIG. 5C is a cross-sectional illustration of the capacitance boost feature in the backside layers of the package substrate, in accordance with an embodiment.

Referring now to FIG. 5C, a cross-sectional illustration of the capacitance boost modulator 554 is shown, in accordance with an embodiment. In an embodiment, the capacitance boost modulator 554 may include a plurality of layers connected together by vias 572. For example, a single via 572 may be provided between each of the layers. In an embodiment, each layer may include one or more stubs 574 that extend out from a central region of the pad. As shown, the stubs 574 of each layer overlap each other in order to increase the capacitance. In other embodiments, stubs may be offset from each other in order to modulate the amount of capacitance provided by the stubs 574.

Referring now to FIGS. 6A-6E, a series of plan view illustrations depicting various pad configurations is shown, in accordance with an embodiment. While several examples are shown herein, it is to be appreciated that other architectures may also be used so long as the architecture includes a pad with at least one stub extending out from the pad.

Figure 6A:
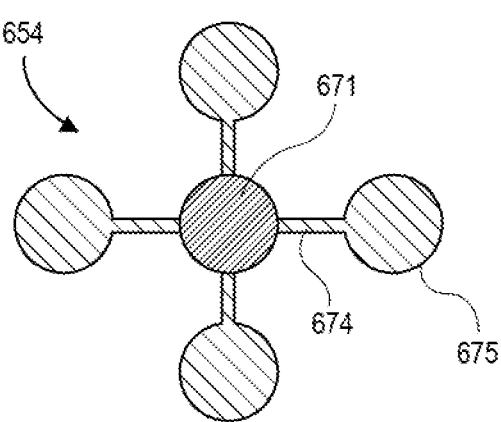
FIG. 6A is a plan view illustration of distal pads coupled to a pad to form a capacitance boost feature in the backside layers of the package substrate, in accordance with an embodiment.

Referring now to FIG. 6A, a plan view illustration of a layer of the capacitance boost modulator 654 is shown, in accordance with an embodiment. In an embodiment, the capacitance boost modulator 654 includes a central pad 671. The central pad 671 may be a circular pad or any other shaped pad. In an embodiment, a plurality of stubs 674 may extend out from the central pad 671. While four stubs 674 are shown, it is to be appreciated that any number of stubs 674 may be used, in accordance with different embodiments. In the illustrated embodiment, the stubs 674 are provided in a cross layout. In other embodiments, the stubs 674 may include any other layout.

In an embodiment, distal pads 675 may be included at the distal end of the stubs 674 away from the central pad 671. In an embodiment, the distal pads 675 may be substantially similar in size and shape to the central pad 671. In other embodiments, the distal pads 675 may have a different size and/or shape than the central pad 671. Increasing the area of the distal pads 675 may increase the capacitance generated by the capacitance boost modulator 654.

Figure 6B:
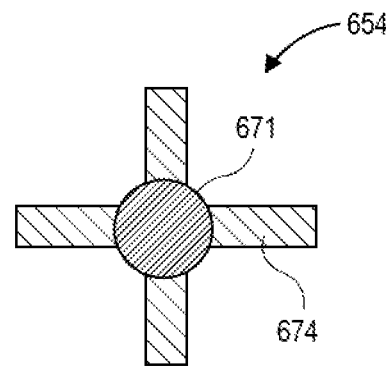
FIG. 6B is a plan view illustration of stubs that extend out from a pad to form a capacitance boost feature in the backside layers of the package substrate, in accordance with an embodiment.

Referring now to FIG. 6B, a plan view illustration of a capacitance boost modulator 654 is shown, in accordance with an additional embodiment. As shown, a plurality of stubs 674 extend out from the central pad 671. Instead of having a distal pad, the ends of the stubs 674 may not have any pad architecture. That is, the width of the end of the stub 674 may be substantially similar to the width of the stub 674 at the beginning of the stub 674. While four stubs 674 are shown, it is to be appreciated that the capacitance boost modulator 654 may include any number of stubs 674 and have any layout configuration.

Figure 6C:
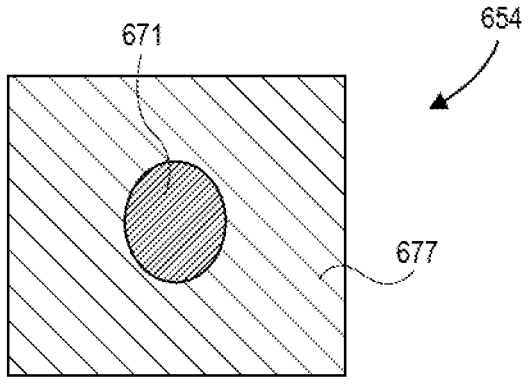
FIG. 6C is a plan view illustration of a patch around a pad to form a capacitance boost feature in the backside layers of a package substrate, in accordance with an embodiment.

Referring now to FIG. 6C, a plan view illustration of a capacitance boost modulator 654 is shown, in accordance with an additional embodiment. In an embodiment, the capacitance boost modulator 654 may include a patch 677 that is provided around the central pad 671. In some embodiments, there may not be a discernable boundary between the central pad 671 and the patch 677. That is, a single large pad with a rectangular shape may be present in the capacitance boost modulator 654 in some embodiments. In other embodiments, the patch 677 may include a cutout that is larger than the central pad 671, and the central pad 671 may be electrically coupled to the patch 677 by stubs.

Figure 7A:
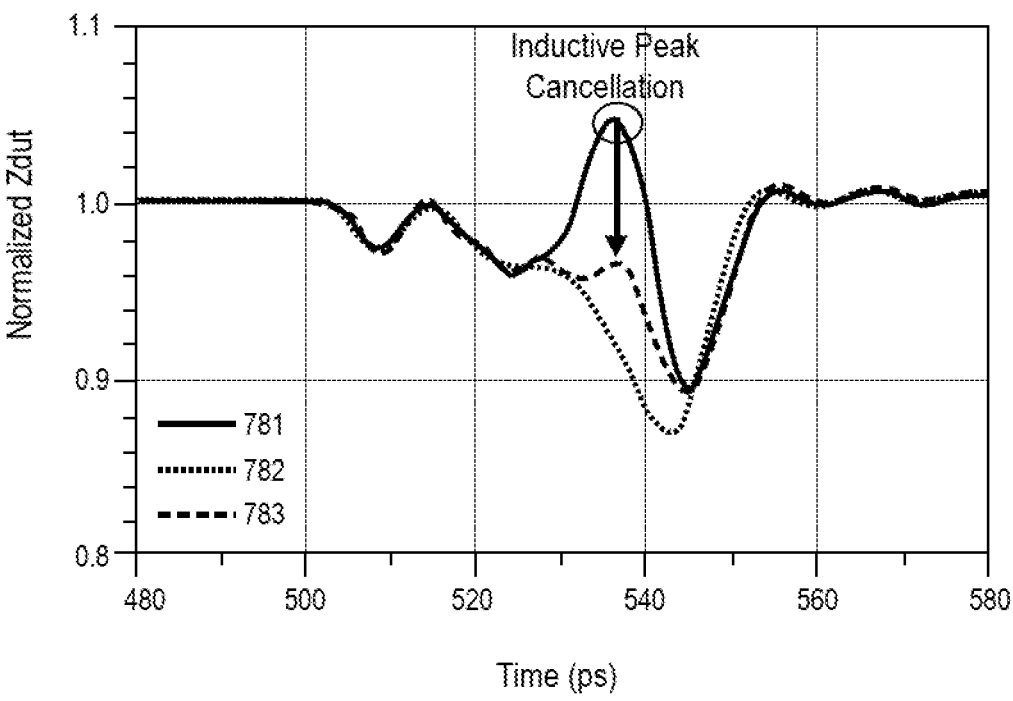
FIG. 7A is a graphs of impedance profiles of interconnects using existing solutions, an inductance reduction feature, and a capacitance boost feature, in accordance with an embodiment.
Figure 7B:
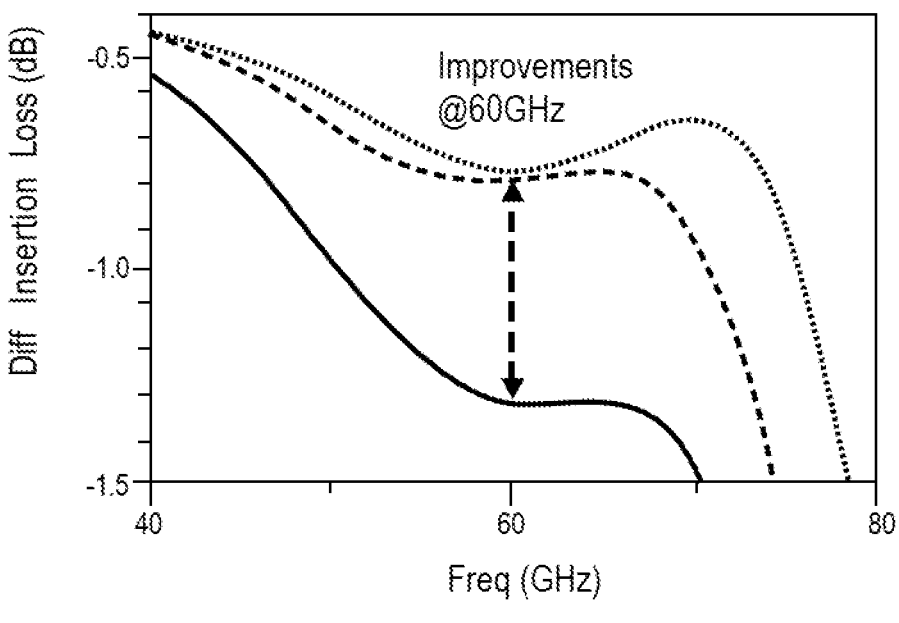
FIG. 7B is a graph of insertion loss of interconnects using existing solutions, an inductance reduction feature, and a capacitance boost feature, in accordance with an embodiment.
Figure 7C:
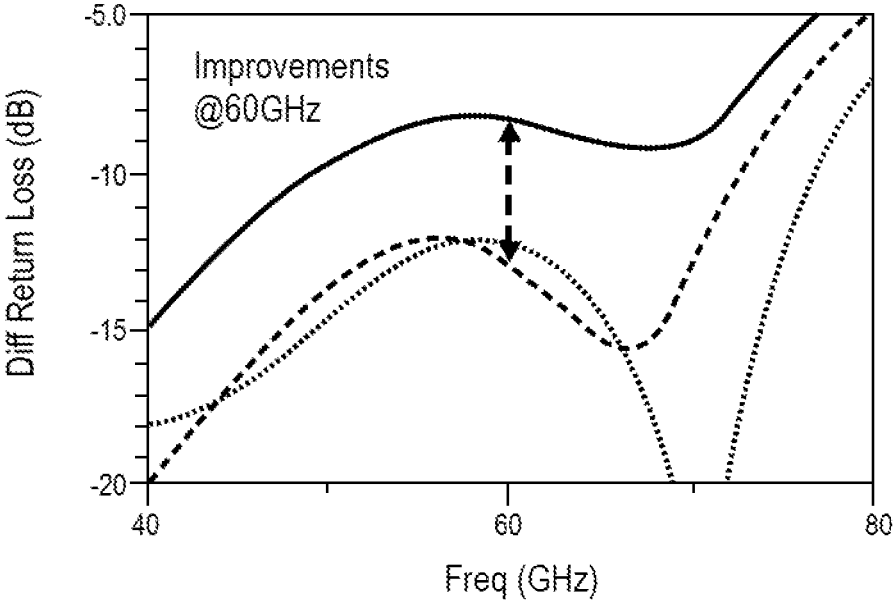
FIG. 7C is a graph of the return loss of interconnects using existing solutions, an inductance reduction feature, and a capacitance boost feature, in accordance with an embodiment.

Referring now to FIGS. 7A-7C, graphs depicting the electrical performance of the capacitance boost modulator and the inductance reduction modulator compared to existing vertical interconnect architectures are shown, in accordance with an embodiment. In the structures depicted in FIGS. 7A-7C, the core of the package substrate is an organic dielectric core with glass reinforcement.

Referring now to FIG. 7A, a graph of the impedance profile of the various architectures is shown, in accordance with an embodiment. The line 781 is the traditional vertical transition, the line 782 is the vertical transition with the inductance reduction modulator, and the line 783 is the vertical transition with the capacitance boost modulator. As shown, the traditional vertical transition has an inductive peak at around 535 ps. This inductive peak is mitigated in both the inductance reduction modulator and the capacitance boost modulator.

Referring now to FIG. 7B, a graph of the insertion loss is shown, in accordance with an embodiment. As shown, the capacitance boost modulator reduces the insertion loss to approximately −0.8 dB at 60 GHz, which is a 38% improvement from a traditional vertical transition. Additionally, the insertion loss of the inductance reduction modulator is reduced to approximately −0.77 dB at 60 GHz, which is a 41% improvement from the traditional vertical transition. Additionally, the 1 dB insertion loss bandwidth of the traditional vertical transition is approximately 50 GHz. The capacitance boost modulator and the inductance reduction modulator may result in an improvement of approximately 20 GHz and approximately 25 GHz, respectively at 1 dB insertion loss.

Referring now to FIG. 7C, a graph of the return loss for the various architectures is shown, in accordance with an embodiment. As shown, the return loss of the capacitance boost modulator is improved to approximately −12.9 dB at 60 GHz, which is an approximately 4.7 dB improvement over the traditional vertical transition. Similarly, the return loss of the inductance reduction is improved to approximately −12.3 dB at 60 GHz, which is an approximately 4.1 dB improvement over the traditional vertical transition.

The stacked via modulator is utilized to improve the bandwidth of the vertical transition from the package substrate to the board. The core of the package substrate may be an organic material, glass, or any other feasible material. The interconnect connecting the package substrate to the board may be ball grid array (BGA) balls, pin sockets (e.g., land grid array (LGA), pin grid array (PGA), etc.) or any other conventional interconnect.

Figure 8:
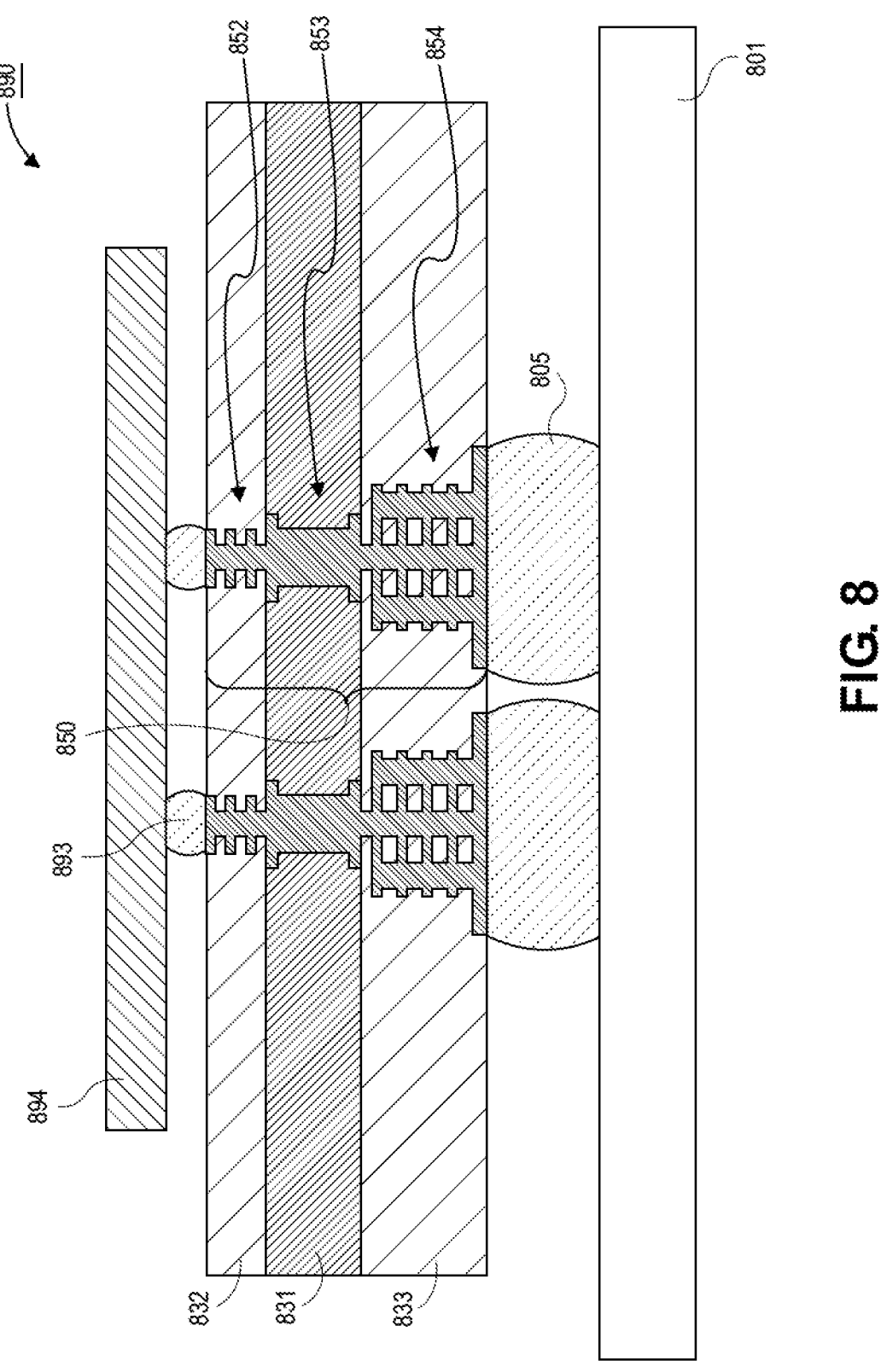
FIG. 8 is a cross-sectional illustration of an electronic system with a package substrate that includes a vertical interconnect with an inductance reduction feature in the backside package layers, in accordance with an embodiment.

Referring now to FIG. 8, a cross-sectional illustration of an electronic system 890 is shown, in accordance with an embodiment. In an embodiment, the electronic system 890 comprises a board 801, such as a PCB. In an embodiment, a package substrate is coupled to the board 801 by interconnects 805. For example, the interconnects 805 may be BGA balls or any other suitable interconnect architecture.

In an embodiment, the package substrate comprises front side layers 832, a core 831, and backside layers 833. A vertical interconnect 850 is provided through the layers 832, 831, and 833. In an embodiment the vertical interconnect 850 comprises micro vias 852 that pass through the front side layers 832, and a PTH 853 that passes through the core 831. In an embodiment, the vertical interconnect 850 further comprises a modulator structure that is provided in the backside layers 833. For example, an inductance reduction modulator 854 is provided through the backside layers 833. The inductance reduction modulator 854 may be similar to any of the inductance reduction modulators described in greater detail above. In other embodiments, a capacitance boost modulator similar to any of the embodiments described in greater detail above may be provided in the backside layers 833. In some embodiments, a combination of capacitance boost modulators and inductance reduction modulators may be included in the backside layers.

In an embodiment a die 894 may be coupled to the package substrate by interconnects 893. The interconnects 893 may be solder balls or the like. In an embodiment, the die 894 may be any type of die. For example, the die may be a processor, a graphics processor, a memory device, or the like. Additionally, while a single die 894 is shown, it is to be appreciated that multi-die 894 architectures may also be used in accordance with embodiments described herein.

Figure 9:
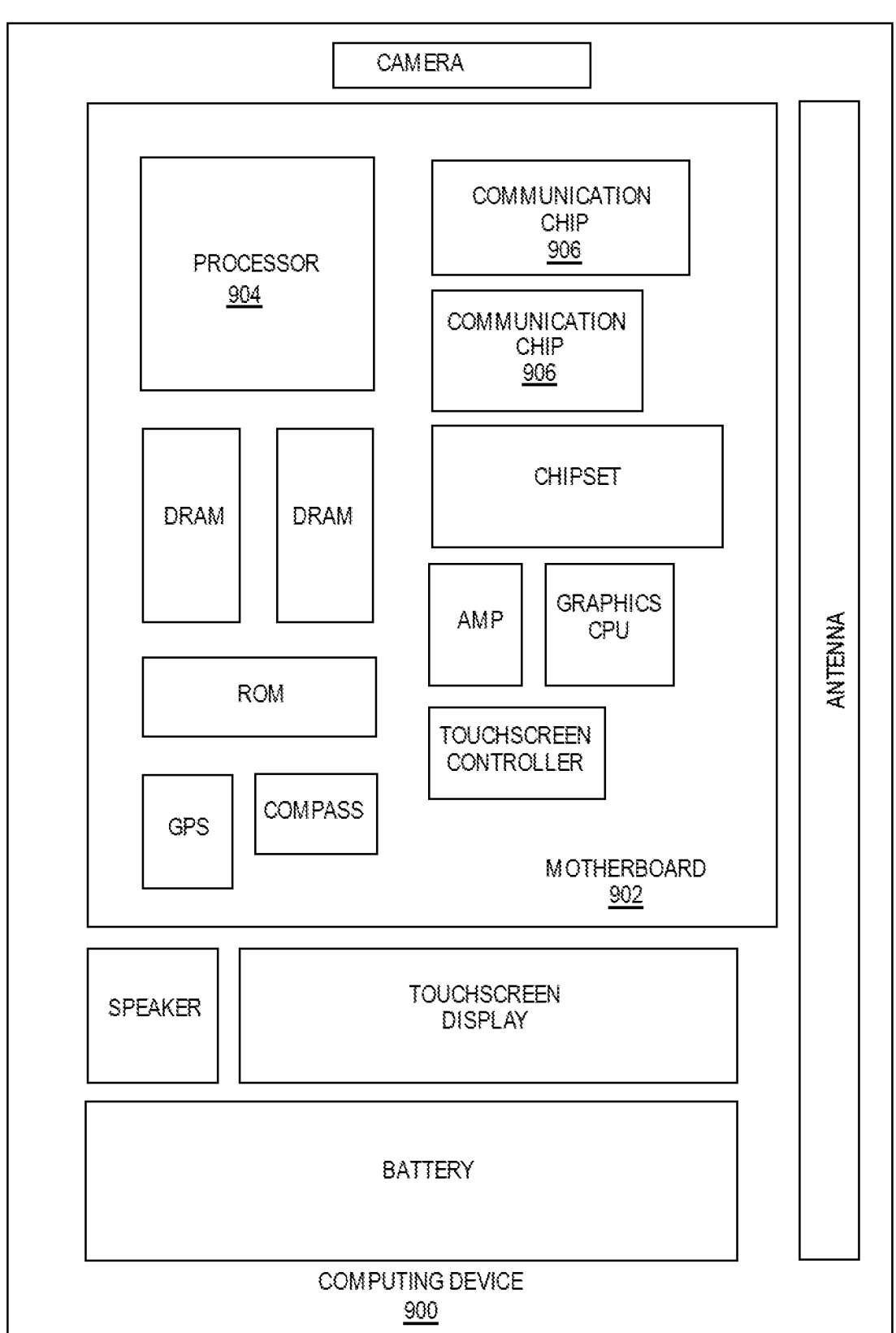
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be part of an electronic package that includes inductance reduction modulators and/or capacitance boost modulators, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be part of an electronic package that includes inductance reduction modulators and/or capacitance boost modulators, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: first substrate layers; a core under the first substrate layers; second substrate layers under the core; and an interconnect through the first substrate layers, the core, and the second substrate layers, wherein a portion of the interconnect through the second substrate layers comprises: a pad; and a plurality of vias extending away from the pad.

Example 2: the electronic package of Example 1, wherein the pad is rectangular.

Example 3: the electronic package of Example 2, wherein the plurality of vias comprises at least three vias.

Example 4: the electronic package of Example 1, wherein the pad is triangular.

Example 5: the electronic package of Example 1, wherein the pad is square.

Example 6: the electronic package of Example 5, wherein the plurality of vias comprises four vias, wherein each via is proximate to a corner of the square pad.

Example 7: the electronic package of Examples 1-6, wherein the plurality of vias comprises at least six vias, and wherein the plurality of vias are laid out in a hexagon pattern.

Example 8: the electronic package of Examples 1-7, wherein the plurality of vias comprises at least eight vias, and wherein the plurality of vias are laid out in a circular pattern.

Example 9: the electronic package of Examples 1-8, wherein the interconnect is for single ended signaling.

Example 10: the electronic package of Examples 1-8, further comprising: a second interconnect through the first substrate layers, the core, and the second substrate layers and adjacent to the interconnect, wherein a portion of the second interconnect through the second substrate layers comprises: a second pad; and a second plurality of vias extending away from the second pad.

Example 11: the electronic package of Example 10, wherein the interconnect and the second interconnect are a differential signaling pair.

Example 12: the electronic package of Examples 1-11, wherein the interconnect is configured to accommodate at least a 200 Gbps signaling speed.

Example 13: an electronic package, comprising: first substrate layers; a core under the first substrate layers;

second substrate layers under the core; and an interconnect through the first substrate layers, the core, and the second substrate layers, wherein a portion of the interconnect through the second substrate layers comprises: a pad; and a stub that extends laterally out from the pad.

Example 14: the electronic package of Example 13, further comprising: a plurality of stubs extending out from the pad.

Example 15: the electronic package of Example 14, wherein the plurality of stubs are rectangular stubs.

Example 16: the electronic package of Example 14 or Example 15, further comprising a distal pad at an end of each of the plurality of stubs.

Example 17: the electronic package of Example 13, wherein the stub comprises a patch that surrounds the pad.

Example 18: the electronic package of Example 17, wherein the patch is rectangular.

Example 19: the electronic package of Examples 13-18, further comprising: a via extending away from the pad vertically; a second pad coupled to a second end of the via; and a stub extending out from the second pad.

Example 20: the electronic package of Examples 13-19, wherein the interconnect is for single ended signaling.

Example 21: the electronic package of Examples 13-20, further comprising: a second interconnect through the first substrate layers, the core, and the second substrate layers and adjacent to the interconnect, wherein a portion of the second interconnect through the second substrate layers comprises: a second pad; and a second stub that extends laterally out from the second pad.

Example 22: the electronic package of Example 21, wherein the interconnect and the second interconnect are a differential signaling pair.

Example 23: the electronic package of Examples 13-22 wherein the interconnect is configured to accommodate at least a 200 Gbps signaling speed.

Example 24: an electronic system, comprising: a board; an electronic package coupled to the board, wherein the electronic package comprises: first substrate layers; a core under the first substrate layers; second substrate layers under the core; and an interconnect through the first substrate layers, the core, and the second substrate layers, wherein a portion of the interconnect through the second substrate layers comprises: a pad and a plurality of vias extending away from the pad, or a pad and a stub that extends laterally out from the pad; and a die coupled to the electronic package.

Example 25: the electronic system of Example 24, wherein the interconnect is configured to accommodate at least a 200 Gbps signaling speed.

What is claimed is:

1. An electronic package, comprising:
first substrate layers;
a core under the first substrate layers;
second substrate layers under the core; and
an interconnect through the first substrate layers, the core, and the second substrate layers, wherein a portion of the interconnect through the second substrate layers comprises:
a pad, wherein the pad is square; and
a plurality of vias extending away from the pad, wherein the plurality of vias comprises four vias, and wherein each via is proximate to a corner of the square pad; and wherein a portion of the interconnect through the core comprises a plated through hole having a maximum lateral width, wherein the pad of the portion of the interconnect through the second substrate layers has a lateral width greater than the maximum lateral width of the plated through hole.

2. The electronic package of claim 1, wherein the interconnect is for single ended signaling.

3. The electronic package of claim 1, further comprising:
a second interconnect through the first substrate layers, the core, and the second substrate layers and adjacent to the interconnect, wherein a portion of the second interconnect through the second substrate layers comprises:
a second pad; and
a second plurality of vias extending away from the second pad.

4. The electronic package of claim 3, wherein the interconnect and the second interconnect are a differential signaling pair.

5. The electronic package of claim 1, wherein the interconnect is configured to accommodate at least a 200 Gbps signaling speed.

6. An electronic package, comprising:
first substrate layers;
a core under the first substrate layers;
second substrate layers under the core; and
an interconnect through the first substrate layers, the core, and the second substrate layers, wherein a portion of the interconnect through the second substrate layers comprises:
a pad; and
a plurality of vias extending away from the pad; and
wherein a portion of the interconnect through the core comprises a plated through hole having a maximum lateral width, wherein the pad of the portion of the interconnect through the second substrate layers has a lateral width greater than the maximum lateral width of the plated through hole, wherein the plurality of vias comprises at least six vias, and wherein the plurality of vias are laid out in a hexagon pattern.

7. An electronic package, comprising:
first substrate layers;
a core under the first substrate layers;
second substrate layers under the core; and
an interconnect through the first substrate layers, the core, and the second substrate layers, wherein a portion of the interconnect through the second substrate layers comprises:
a pad; and
a plurality of vias extending away from the pad; and
wherein a portion of the interconnect through the core comprises a plated through hole having a maximum lateral width, wherein the pad of the portion of the interconnect through the second substrate layers has a lateral width greater than the maximum lateral width of the plated through hole, wherein the plurality of vias comprises at least eight vias, and wherein the plurality of vias are laid out in a circular pattern.

8. An electronic package, comprising:
first substrate layers;
a core under the first substrate layers;
second substrate layers under the core; and
an interconnect through the first substrate layers, the core, and the second substrate layers, wherein a portion of the interconnect through the second substrate layers comprises:

a pad; and a stub that extends laterally out from the pad, wherein the stub comprises a patch that surrounds the pad; and wherein a portion of the interconnect through the core comprises a plated through hole having a maximum lateral width, wherein the pad of the portion of the interconnect through the second substrate layers has a lateral width greater than the maximum lateral width of the plated through hole.

9. The electronic package of claim 8, further comprising: a plurality of stubs extending out from the pad.

10. The electronic package of claim 9, wherein the plurality of stubs are rectangular stubs.

11. The electronic package of claim 9, further comprising a distal pad at an end of each of the plurality of stubs.

12. The electronic package of claim 8, wherein the patch is rectangular.

13. The electronic package of claim 8, further comprising: a via extending away from the pad vertically;

a second pad coupled to a second end of the via; and a stub extending out from the second pad.

14. The electronic package of claim 8, wherein the interconnect is for single ended signaling.

15. The electronic package of claim 8, further comprising: a second interconnect through the first substrate layers, the core, and the second substrate layers and adjacent to the interconnect, wherein a portion of the second interconnect through the second substrate layers comprises:

a second pad; and a second stub that extends laterally out from the second pad.

16. The electronic package of claim 15, wherein the interconnect and the second interconnect are a differential signaling pair.

17. The electronic package of claim 8 wherein the interconnect is configured to accommodate at least a 200 Gbps signaling speed.

18. An electronic package, comprising:

first substrate layers;

a core under the first substrate layers;

second substrate layers under the core; and an interconnect through the first substrate layers, the core, and the second substrate layers, wherein a portion of the interconnect through the second substrate layers comprises:

a pad; and a plurality of stubs that extend laterally out from the pad, wherein the plurality of stubs are rectangular stubs; and wherein a portion of the interconnect through the core comprises a plated through hole having a maximum lateral width, wherein the pad of the portion of the interconnect through the second substrate layers has a lateral width greater than the maximum lateral width of the plated through hole.

19. An electronic package, comprising:

first substrate layers;

a core under the first substrate layers;

second substrate layers under the core; and an interconnect through the first substrate layers, the core, and the second substrate layers, wherein a portion of the interconnect through the second substrate layers comprises:

a pad; and a plurality of stubs that extend laterally out from the pad; and a distal pad at an end of each of the plurality of stubs; and wherein a portion of the interconnect through the core comprises a plated through hole having a maximum lateral width, wherein the pad of the portion of the interconnect through the second substrate layers has a lateral width greater than the maximum lateral width of the plated through hole.

\* \* \* \* \*